(12) United States Patent
Tong

(10) Patent No.: US 10,904,965 B2
(45) Date of Patent: Jan. 26, 2021

(54) METHOD AND APPARATUS FOR PROVIDING A PASSIVE COLOR CONTROL SCHEME USING BLUE AND RED EMITTERS

(71) Applicant: SIGNIFY HOLDING B.V., Eindhoven (NL)

(72) Inventor: Tao Tong, Fremont, CA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/400,862

(22) Filed: May 1, 2019

(65) Prior Publication Data

US 2019/0261480 A1 Aug. 22, 2019

Related U.S. Application Data

(62) Division of application No. 15/009,610, filed on Jan. 28, 2016, now abandoned, which is a division of application No. 13/708,916, filed on Dec. 7, 2012, now Pat. No. 9,271,368.

(51) Int. Cl.
| | |
|---|---|
| *H05B 45/10* | (2020.01) |
| *H01L 25/075* | (2006.01) |
| *F21K 9/64* | (2016.01) |
| *H05B 45/20* | (2020.01) |
| *H01L 33/50* | (2010.01) |
| *H01L 33/62* | (2010.01) |

(52) U.S. Cl.
CPC ............. *H05B 45/10* (2020.01); *F21K 9/64* (2016.08); *H01L 25/0753* (2013.01); *H01L 33/50* (2013.01); *H05B 45/20* (2020.01); *H01L 33/62* (2013.01); *H01L 2924/0002* (2013.01); *Y02B 20/30* (2013.01)

(58) Field of Classification Search
None
See application file for complete search history.

(56) References Cited

U.S. PATENT DOCUMENTS

| 7,999,463 | B2 | 8/2011 | Nomura | |
|---|---|---|---|---|
| 8,569,974 | B2 * | 10/2013 | Chobot | H05B 33/0872 315/307 |
| 10,098,197 | B2 * | 10/2018 | van de Ven | H05B 33/0866 |

(Continued)

*Primary Examiner* — Amy Cohen Johnson
*Assistant Examiner* — James H Cho
(74) *Attorney, Agent, or Firm* — Patrick T. Driscoll

(57) ABSTRACT

A lighting device capable of generating warm or neutral white light using blue light-emitting diodes ("LEDs"), red LEDs, and/or luminescent material that responds to blue LED emission is disclosed. The lighting device includes multiple first solid-state light-emitting structures ("SLSs"), second SLSs, and balancing resistor element. The first SLS such as a string of blue LED dies connected in series is able to convert electrical energy to blue optical light, which is partially turned into longer wavelength emission by the luminescent material. The second SLS such as a red LED die is configured to convert electrical energy to red optical light, wherein the second SLSs are connected in series. While the first SLSs and second SLSs are coupled in parallel, the balancing resistor element provides load balance for current redistribution between the first and second SLSs in response to fluctuation of operating temperature.

5 Claims, 13 Drawing Sheets

(56) References Cited

U.S. PATENT DOCUMENTS

| | | |
|---|---|---|
| 2007/0171159 A1 | 7/2007 | Lee |
| 2008/0111505 A1 | 5/2008 | Wang et al. |
| 2010/0060175 A1 | 3/2010 | Lethellier |
| 2011/0227497 A1 | 9/2011 | Hu et al. |
| 2011/0278606 A1 | 11/2011 | Suzuki et al. |
| 2011/0285319 A1 | 11/2011 | Chao et al. |
| 2011/0291129 A1* | 12/2011 | Wirth ................ H05B 33/0857 257/89 |
| 2012/0032600 A1* | 2/2012 | Edwards ................ H05B 45/22 315/151 |
| 2012/0176826 A1 | 7/2012 | Lazar |
| 2012/0248995 A1* | 10/2012 | Bakk ................ H05B 33/0857 315/185 R |
| 2012/0306370 A1* | 12/2012 | Van De Ven .......... H05B 45/28 315/113 |
| 2013/0082616 A1 | 4/2013 | Bradford et al. |
| 2013/0088166 A1 | 4/2013 | Varga et al. |
| 2013/0278153 A1* | 10/2013 | Pi .......................... H05B 33/08 315/185 R |
| 2013/0342118 A1 | 12/2013 | Zhang et al. |

* cited by examiner

METHOD AND APPARATUS FOR PROVIDING A PASSIVE COLOR CONTROL SCHEME USING BLUE AND RED EMITTERS

PRIORITY

This application is a divisional application of U.S. patent application Ser. No. 15/009,610, filed on Jan. 28, 2016, which claims the priority benefit of U.S. patent application Ser. No. 13/708,916, filed on Dec. 7, 2012, the contents of which are herein incorporated by reference.

FIELD

The exemplary aspect(s) of the present invention relates to solid-state lighting devices. More specifically, the aspect(s) of the present invention relates to light radiation emitted by a solid-state light apparatus using light-emitting diode ("LED") device.

BACKGROUND

With decades of technical advancements and breakthroughs in the areas of semiconductor based solid-state light emitting devices, Edison's incandescent light bulbs, which typically have 30% or less light efficiency, will soon be replaced with energy-efficient light-emitting diodes ("LEDs"). A conventional LED is small and energy efficient with good lifetime. Various commercial applications of LEDs, such as homes, buildings, traffic lights, and electronic billboards, have already placed in service.

An LED is a semiconductor diode with a biased p-n junction capable of emitting narrow-spectrum light or electroluminescence. Color of emitted light typically depends on the composition of material used in the device. Color variations for visible light are usually defined by electromagnetic radiation or optical wavelengths from approximately 400 nm (nanometer) to 700 nm.

To generate white light, a conventional approach is to combine multiple emission wavelengths of LED sources (e.g., red, green, and blue LEDs) to produce desirable white light with various correlated color temperature (CCT). Alternatively, LEDs may be combined and/or added with luminescent material such as phosphors to convert at least a portion of LED emitted light to longer wavelength emissions to achieve a combined emission spectrum with white light of various CCT.

The quality of a white light source on color appearance of objects is usually measured by the Color Rendering Index ("CRI"), wherein the highest CRI rating is 100 when the alternative light source closely mimics the radiation spectral distribution of incandescent object at the same color temperature. Typical cool white fluorescent lamps, for example, have a CRI of 62. On the other hand, lamps having multiple component rare-earth phosphors can be constructed with CRI of 80 or better.

To enhance color appearance, a conventional approach is to mix blue LED(s), red LED(s) and some luminescent material that responds to blue emission in a package to generate warm or neutral white light. A problem associated with placing blue LED(s) and red (or orange) LED(s) in a same package is the color shift which is due to different temperature-dependent radiant (or luminous) flux drop as temperature drops. A factor that causes color shift is that the radiant (or luminous) flux drop between blue LED and red LED is different as operating temperature rises. For example, conventional indium gallium nitride ("InGaN") based blue LED chip and aluminum gallium indium phosphide ("AlInGaP") based red LED chip typically have different rate for flux drop in response to temperature change.

SUMMARY

Aspect(s) of present invention discloses a solid-state lighting device ("SLD") capable of generating warm white light using red solid-state light emitter and passive color control scheme. The SLD includes first solid-state light-emitting structures ("SLSs"), second SLSs, and balancing resistors. In one example, the first SLSs are blue light-emitting diodes ("LEDs") and the second SLSs are red LEDs. The blue LED, for example, is able to convert electrical energy to blue optical light and the red LED is capable of converting electrical energy to red optical light. To convert blue light into the light with longer wavelength such as in the yellow or red region(s), luminescent materials such as phosphor material can be added. The first SLSs are connected in series as a string and the second SLSs are connected in series as a second string. The string of blue LEDs and string of red LEDs, in one aspect, are coupled in parallel. A balancing resistor coupled to a string is configured to provide load balance and current redistribution between the strings in response to temperature fluctuation.

It is understood that other aspects of the present invention will become readily apparent to those skilled in the art from the following detailed description, wherein it is shown and described only exemplary configurations of an LED by way of illustration. As will be realized, the present invention includes other and different aspects and its several details are able to be modified in various other respects, all without departing from the spirit and scope of the present invention. Accordingly, the drawings and the detailed description are to be regarded as illustrative in nature.

BRIEF DESCRIPTION OF THE DRAWINGS

The exemplary aspect(s) of the present invention will be understood more fully from the detailed description given below and from the accompanying drawings of various aspects of the invention, which, however, should not be taken to limit the invention to the specific aspects, but are for explanation and understanding only.

DETAILED DESCRIPTION

Figure 1:
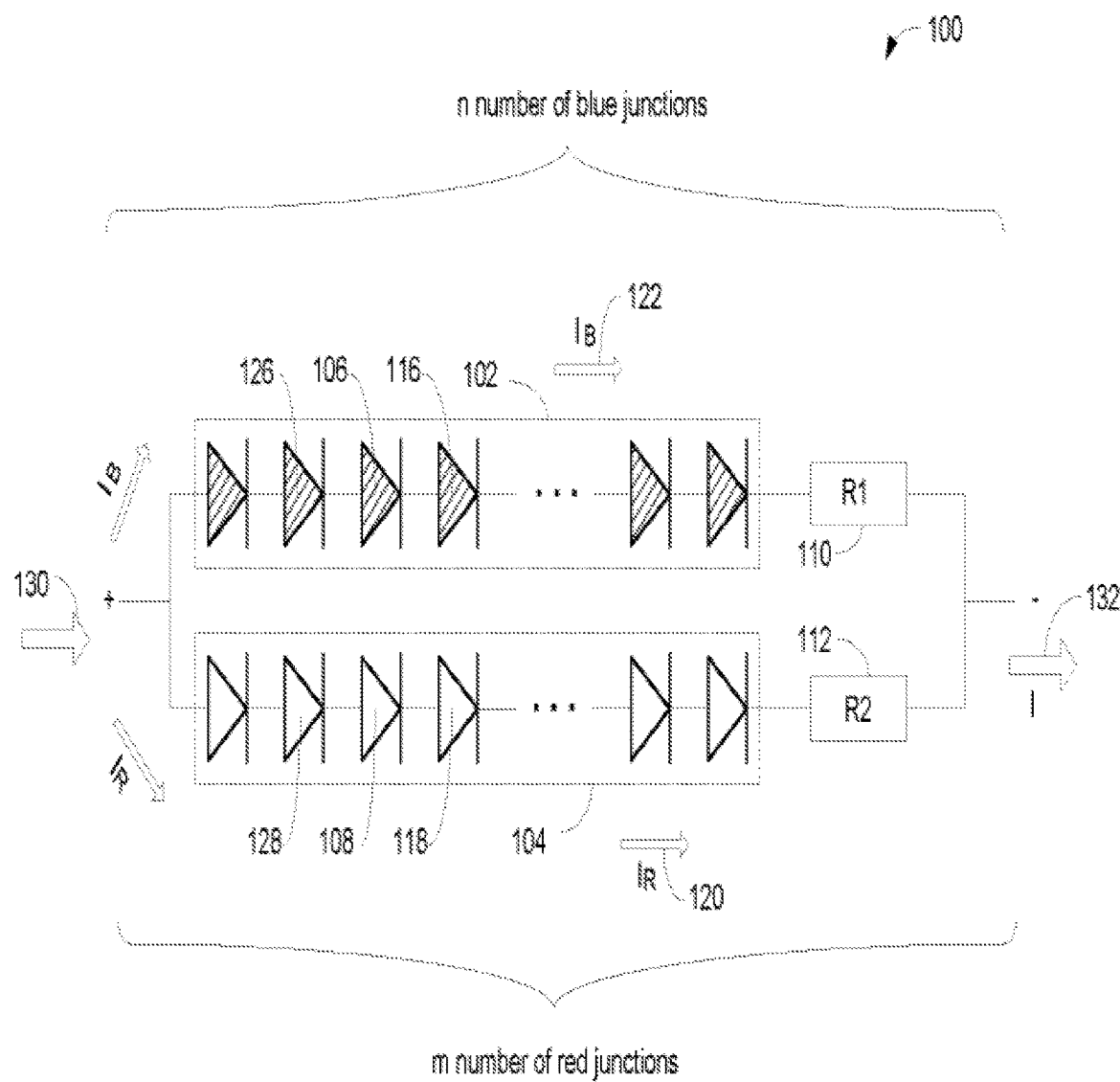
FIG. 1 is a diagram illustrating a solid-state lighting device ("SLD") having a string of blue LEDs, a string of red LEDs, and/or luminescent material capable of adjusting current flow in response to temperature change in accordance with one aspect of the present invention.

Aspects of the present invention are described herein in the context of a method, device, and apparatus of solid-state lighting device capable of generating warm white light using a set of blue and red light-emitting diodes ("LEDs").

The present invention is described more fully hereinafter with reference to the accompanying drawings, in which various aspects of the present invention are shown. This invention, however, may be embodied in many different forms and should not be construed as limited to the various aspects of the present invention presented throughout this disclosure.

Rather, these aspects are provided so that this disclosure is thorough and complete, and fully conveys the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skills in the art to which this invention belongs. It will be further understood that terms, such as those defined in commonly used dictionaries, should be interpreted as having a meaning that is consistent with their meaning in the context of the relevant art and this disclosure.

Various aspects of an LED luminaire will be presented. However, as those skilled in the art will readily understand, these aspects of invention may be extended to aspects of LED luminaries without departing from the invention. The LED luminaire may be configured as a direct replacement for conventional luminaries, including, by way of example, recessed lights, surface-mounted lights, pendant lights, sconces, cove lights, track lighting, under-cabinet lights, landscape or outdoor lights, flood lights, search lights, street lights, strobe lights, bay lights, strip lights, industrial lights, emergency lights, balanced arm lamps, accent lights, background lights, and other light fixtures.

As used herein, the term "light fixture" shell mean the outer shell or housing of a luminaire. The term "luminaire" shell mean a light fixture complete with a light source and other components (e.g., a fan for cooling the light source, a reflector for directing the light, etc.), if required. The term "LED luminaire" shall mean a luminaire with a light source comprising one or more LEDs. LEDs are well known in the art, and therefore, will only briefly be discussed to provide a complete description of the invention.

An aspect of present invention discloses a solid-state lighting device ("SLD") having solid-state light-emitting structures ("SLSs") and balancing resistor(s) capable of generating warm white light using passive color control scheme. The SLS, for example, can also be referred to as an LED, LED die, LED chip, LED junction, or the like. The terms "LED," "LED die," "LED chip," and/or "LED junction" are herein used interchangeable. The SLD includes a string of blue LEDs connected in series, a string of red LEDs connected in series, and at least one balancing resistor. The string of blue LEDs and string of red LEDs, in one aspect, are coupled in parallel. The balancing resistor is configured to provide load balancing between the strings. SLD is able to maintain warm white light using automatic current redistribution between the string of blue LEDs and string of red LEDs in response to temperature fluctuation.

FIG. 1 is a diagram illustrating a SLD 100 having two strings of LEDs capable of adjusting magnitude of current in response to temperature change in accordance with one aspect of the present invention. SLD 100 includes a blue string 102 having multiple blue LEDs, a red string 104 having multiple red LEDs, and two balancing resistors 110-112 (or R1 and R2). R1 is coupled to blue string 102 in series and R2 is coupled to red string 104 in series. Strings 102-104 together with R1 and R2 are connected in parallel as shown in FIG. 1. SLD 100 is capable of maintaining warm white light within a predefined range of color point using a passive color control scheme able to facilitate redistributing current based on temperature fluctuation. In one example, the predefined range of color point may have a color temperature ranging between CRI of 80 and CRI of 90. It should be noted that the underlying concept of the exemplary aspect(s) of the present invention would not change if one or more elements (or devices) were added to or removed from SLD 100.

String of blue LEDs or blue string 102, in one aspect, includes multiple LED dies such as LEDs 106 and 116 connected in series. LED dies such as LEDs 106 and 116 may be fabricated by InGaN material that allows LED dies to emit blue light. It should be noted that the underlying concept does not change if LED dies in blue string 102 are fabricated by other chemical compounds as long as they emit blue light efficiently. Each LED die such as LED 106 contains a positive terminal and a negative terminal. The positive terminal of LED 106, for example, is coupled to the negative terminal of LED 126 and the negative terminal of LED 106 is coupled to the positive terminal of LED 116. When all LED dies in blue string 102 are linked in series as a string, blue string 102 includes a positive end and a negative end. When a current such as 1B 122 travels from the positive end of blue string 102 to the negative end of blue string 102, LED dies in string 102 such as LED dies 106 and 116 emit blue light.

String of red LEDs or red string 104 includes multiple LED dies such as LEDs 108 and 118 connected in series. LED dies such as LEDs 108 and 118 may be fabricated by AlInGaP material that allows the LEDs to emit red light. It should be noted that the underlying concept does not change if LED dies in red string 104 are fabricated materials other than AlInGaP as long as they emit red light efficiently. Each LED die such as LED die 108 contains a positive terminal and a negative terminal. The positive terminal of LED die 108, for example, is coupled to the negative terminal of LED 128 and the negative terminal of LED 108 is coupled to the positive terminal of LED 118. When all LED dies in red string 104 are linked in series as a string, string of red LEDs or red string 104 has a positive end and a negative end. When a current such as IR 120 travels from the positive end of string 104 to the negative end of string 104, LED dies in string 104 such as LED dies 108 and 118 emit red light or red flux.

Blue string 102, in an alternative aspect, contains n number of blue LED junctions and red string 104 contains m number of red LED junctions, where n and m are integers. The blue LED junctions are connected in series and the red LED junctions are also coupled in series. Strings 102-104 are coupled in parallel as shown in FIG. 1. The total number of blue LEDs (n) and red LEDs (m) are arranged so that the voltages across both strings 102-104 should be approximately the same.

Balancing resistors 110-112 or RI-R2, in one aspect, are coupled to strings 102-104 in series and are used to provide load balancing for strings 102-104. Depending on characteristics of the red and blue LED dies, REL and R2 may or may not have the same resistance. In other examples, one or both RI-R2 may be removed if blue string 102 and red string 104 are substantially or approximately balanced.

During operation, when current 130 enters SLD 100, it splits into IR 120 as a first current flow and 1B 122 as a second current flow wherein IR 120 and 1B 122 travel through strings 104 and 102, respectively. When 1B 122 passes through string 102, blue LEDs such as LED 106 emits blue light or flux. Similarly, when IR 120 travels through string 104, red LEDs such as LED 108 emits red light or flux. After 1B 122 and IR 120 pass through RI and R2, they merge into current 132 before exiting SLD 100. It should be noted that current 130 and 132, in one aspect, should have substantially the same magnitude. In one example, yellow or green phosphor such as yttrium aluminum garnet ("YAG") is used with blue string 102 to produce cool or white light. Depending on numbers of blue LEDs, red LEDs, and amount of phosphor are used, a warm white light or a predefined range of color point may be maintained.

To adjust or maintain a predefined range of color point, SLD 100, in one aspect, is capable of redistribute current between strings 102-104 based on differential voltage drop ("Vf") across strings due to fluctuations of operating temperature. The operating temperature, in one example, is referred to as device physical temperature during operation. For example, when the operating temperature rises from room temperature such as 20 Celsius ("° C.") to 80° C., the red radiant flux generated by red LEDs drops more rapidly than the blue radiant flux generated by blue LEDs. To maintain voltage across strings 102-104, the current flowing through strings 102-104 may be automatically adjusted which effectively compensates the loss of red flux. For example, when Vf at red string 104 drops more than Vf at blue string 102, IR 120 is automatically adjusted by increasing the magnitude of IR 120. The red LEDs such LED 108 illuminates more red flux in response to IR 120 with large magnitude. Because of the additional red flux generated by red string 104, the predefined range of color point is maintained.

It should be noted that SLD 100 as a passive system is capable of packaging one or more strings of multi-junction blue LEDs connected with one or more strings of multi-junction red LEDs in parallel. The blue and red strings 102-104 are driven in parallel with current flows. With differential Vf drops (or reductions) between the blue LED chips and red LED chips, SLD 100 is able to implement a passive color control scheme based on Vf drops redistribute current between blue and red strings 102-104 to mitigate overall color shift.

An advantage of using SLD 100 is that the lighting device is able to maintain warm white light within a predefined range of color point using electrical characteristics of circuits. Another advantage of using red LEDs in SLD 100 is to minimize photon conversion loss (or States loss).

Figure 2:
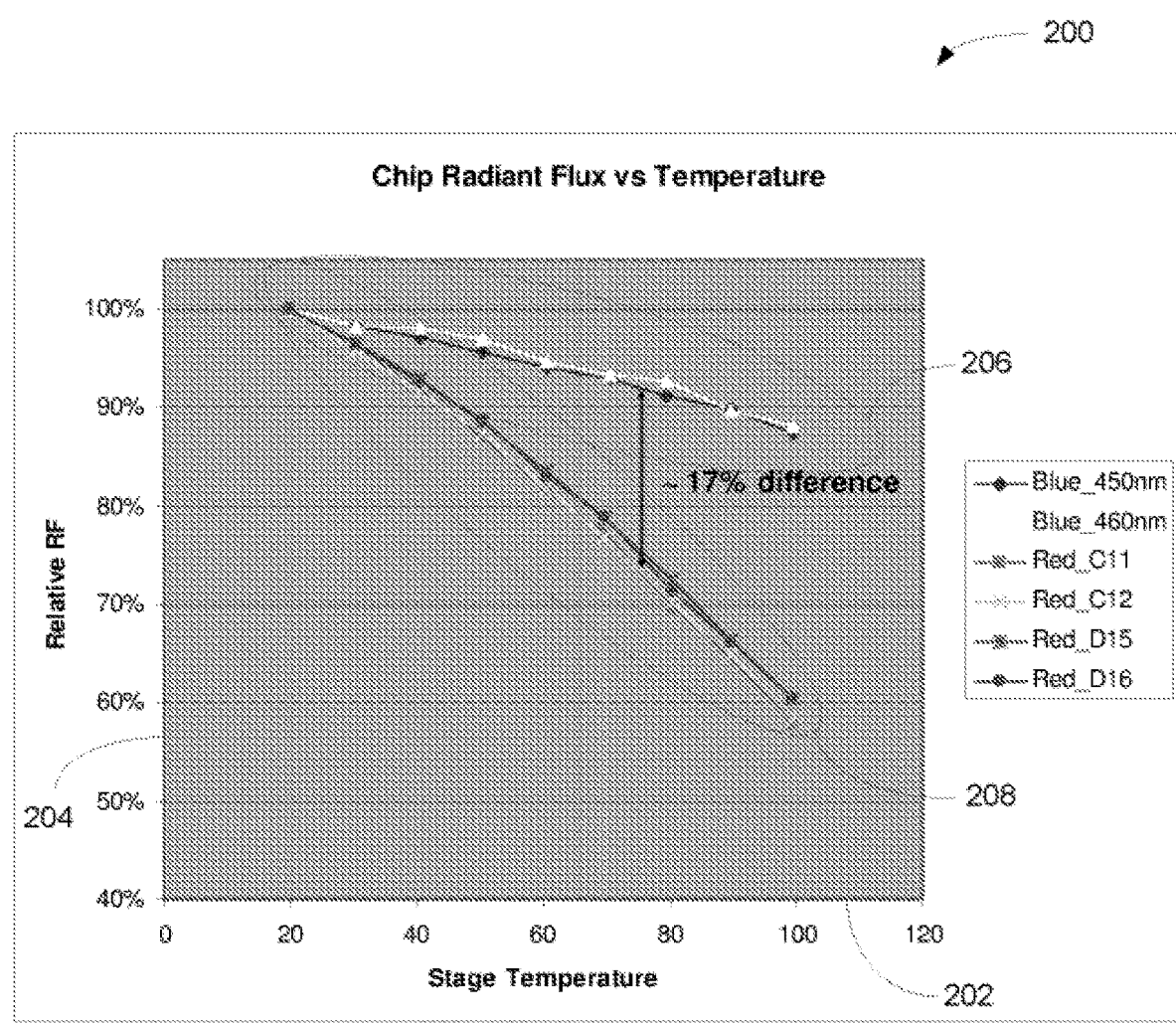
FIGS. 2-3 are charts illustrating relationships between radiant flux versus temperature in connection to red LED and blue LED.

FIG. 2 is a chart 200 illustrating a relationship between radiant flux and stage temperature for different LEDs such as red LEDs and blue LEDs. Chart 200 shows the X-axis and Y-axis wherein X-axis represents relative radiant flux 202 and Y-axis represents stage temperature 204. Chart 200 illustrates a blue curve 206 and a red curve 208 with respect to X-axis and Y-axis. Blue curve 206, in one example, shows behavior of blue flux generated by a blue LED based on temperature fluctuations. Similarly, red curve 208 shows behavior of red flux generated by a red LED based on changes in temperature changes.

Blue curve 206 and red curve 208 illustrate that the emission of red flux is more sensitive to temperature change than the emission of blue flux. For example, when the blue LED and red LED are initially activated at the room temperature around 20° C., both red flux and blue flux are emitted at their predefined calibrated setting. When blue and red LEDs are gradually heating up, the amount of blue and red flux begins to drop as shown in Chart 200. When, for example, the operating temperature reaches 80° C. for both red and blue LEDs, the blue flux could drop 10 to 13% of the original setting while the red flux can drop up to 30% of the original setting. In other words, the red flux could drop or reduce 17% more flux than the blue flux whereby color shift of combined light emitted can easily occur.

Both blue flux and red flux are dropped or reduced as a function of temperature, but the amount the reduction of flux between the blue color and red color is different. Since the red LED is more sensitive to temperature change, a self correction or passive color control scheme is needed. It should be noted that the difference of flux reduction between red flux and blue flux could be even greater if the operating temperature rises above 100° C.

Figure 3:
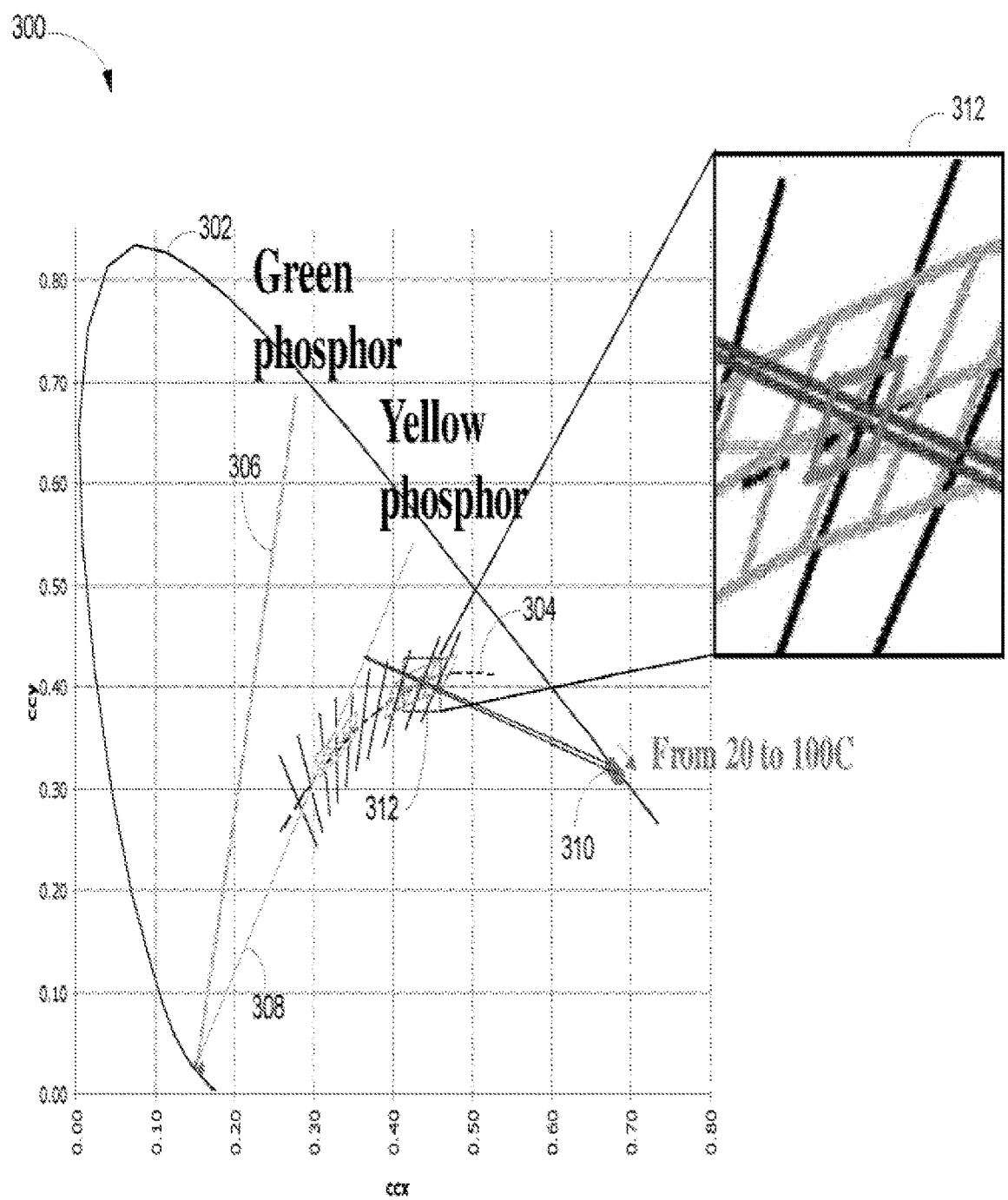

FIG. 3 is a graph 300 showing an envelope of chromaticity diagram 302 with a blackbody curve 304 illustrating a spectrum of light color in connection to red LED and blue LED. Envelope of chromaticity diagram 302 illustrates a region of radiant wavelength region that is visible to human eyes. Graph 300 includes a green phosphor line 306, yellow phosphor line 308, and red flux 310. Depending on the specific amount of green phosphor, yellow phosphor, and red flux, a white light can be generated around a warm white region 312 which is generally referred to as blackbody radiation at 3000 Kelvin (K). Since green or yellow color is supplied by blue LEDs and red flux is supplied by red LEDs, the color shift can happen when the red flux drops due to the rising temperature.

When red and blue LEDs are placed or fabricated in the same package, the overall color shift of light emission in response to temperature change can occur because the performance of red LED will fluctuate more than the blue LED. For example, as operating temperature rises, the overall light color may gradually change cool white light because of less red flux. As such, to maintain a range of color point from shifting, a passive scheme of self compensation, self correction, and/or self calibrating using electrical property and/or device characteristics to automatically increase the red flux.

Figure 4:
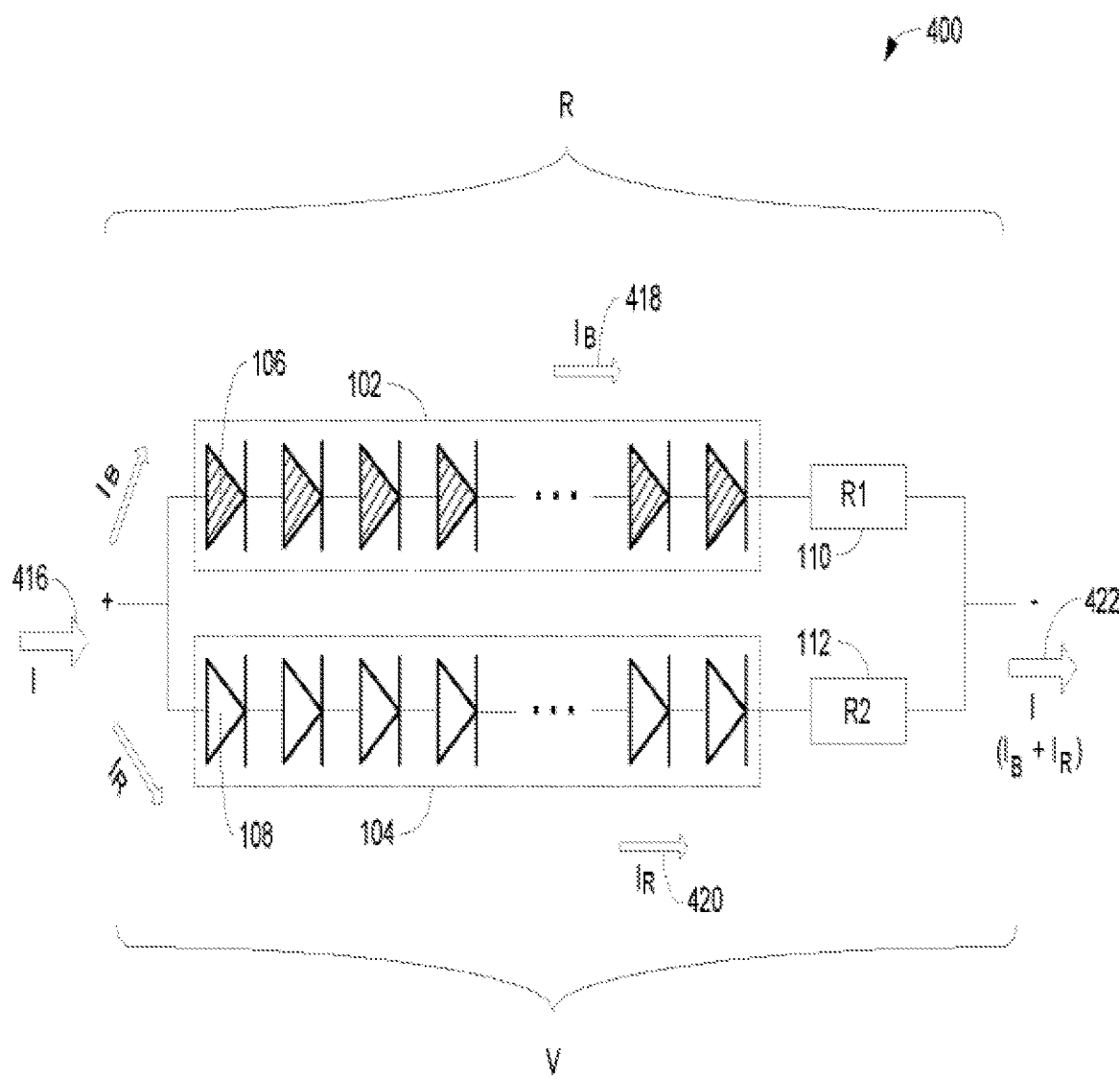
FIGS. 4-6 illustrate a self-adjustment process using electrical characteristics and/or relationship between voltage, current, and resistance to passively redistribute current in response to temperature variation in accordance with one aspect of the present invention.
Figure 5:
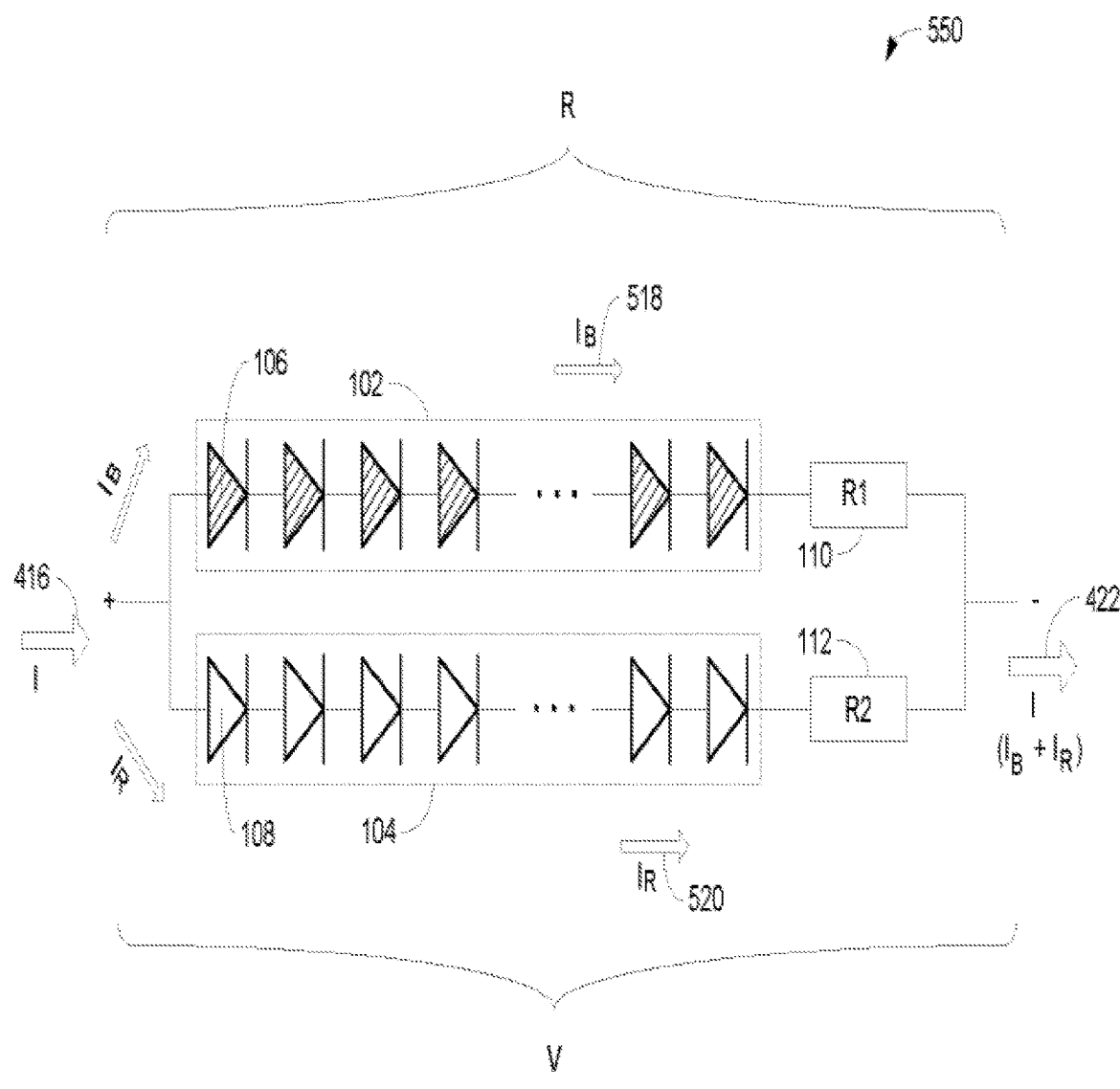
Figure 6:
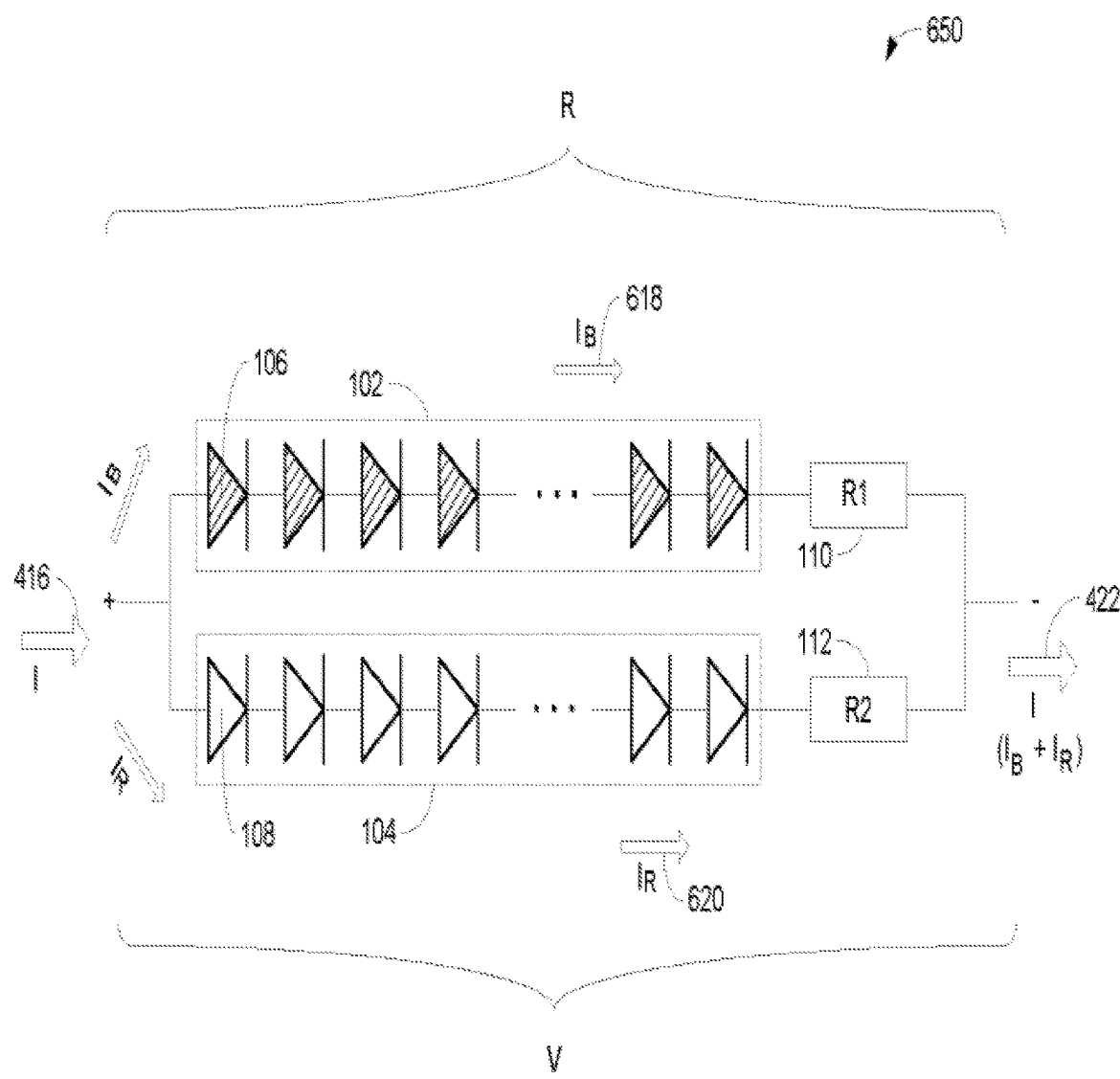

FIGS. 4-6 illustrate a self-adjustment process using electrical characteristics and/or relationship between voltage, current, and resistance (Ohm's law) to passively redistribute current in response to temperature variation in accordance with one aspect of the present invention. FIG. 4, which is similar to FIG. 1, illustrates a SLD 400 having a string of blue LEDs 102, a string of red LEDs 104, and two balancing resistors 110-112 (or R1 and R2). R1 is coupled to string of blue LEDs 102 in series and R1 is coupled to string of red LED 104 in series. Strings of blue and red LEDs together with RI and R2 are connected in parallel as shown in FIG. 4. SLD 400 is capable of maintaining a warm white light within a predefined range of color point (or color temperature) using a passive flux control scheme by redistributing current between strings 102-104 based on temperature fluctuation.

During operation, when current 416 enters SLD 400 which has just been activated with an operating temperature at room temperature such as 20° C., current 416 subsequently splits into IR 420 and 1B 418 wherein IR 420 and 1B 418 travel through strings 104 and 102, respectively. String 102 emits blue light as 1B 418 passes through each blue LED die while string 104 emits red light as IR 420 travels through each red LED dies. After 1B 418 and IR 420 pass through RI and R2, they merge into current I 422 before exiting SLD 400. In one example, yellow or green phosphor such as YAG may be used with blue string 102 to produce cool or white light. Depending on the number of blue LEDs, red LEDs, and amount of phosphor used, a warm white light within a predefined range of color temperature may be achieved and maintained.

As SLD 400 continues to generate warm white light, the operating temperature for every LED die begins to rise. Since the LED dies are generally sensitive to temperature fluctuation, the blue flux emitted by blue LEDs in string 102 and red flux emitted by red LEDs in string 104 begin to change. The loss of red flux is generally greater than the loss of blue flux since red LEDs are more temperature sensitivity than blue LEDs. As such, additional red flux is needed if the warm white light is to be maintained.

When, for example, the operating temperature reaches 60° C. as shown in FIG. 5, SLD 550 incrementally redistributes current to increase magnitude of IR 520 whereby red LEDs in string 104 can emit more red flux in response to the larger current of IR 520. To maintain a predefined range of color point, SLD 550 increases magnitude of IR 520 to obtain additional red flux whereby the loss of red flux due to rising temperature can be properly compensated if a corresponding amount of IR 520 is supplied.

When operating temperature reaches 80° C. as shown in FIG. 6, SLD 650, in one example, has reached a steady state of operating temperature. It should be noted that overall resistance R across strings 102-104 generally has minimal change due to temperature rising. To maintain overall voltage V across strings 102-104 within a predefined voltage range, the current such as 1B 618 and IR 620 is redistributed, recalibrated, and/or self-adjusted based on electrical characteristics of electrical components such as red LEDs and blue LEDs. Since Vf across each red LED die drops more than Vf across each blue LED die, a larger current or IR 620 can mitigate Vf drops across string 104. With a larger magnitude of IR 620, additional red flux is generated accordingly. As such, a passive scheme of color control between blue LEDs and red LEDs can reduce overall color shift.

Figure 7:
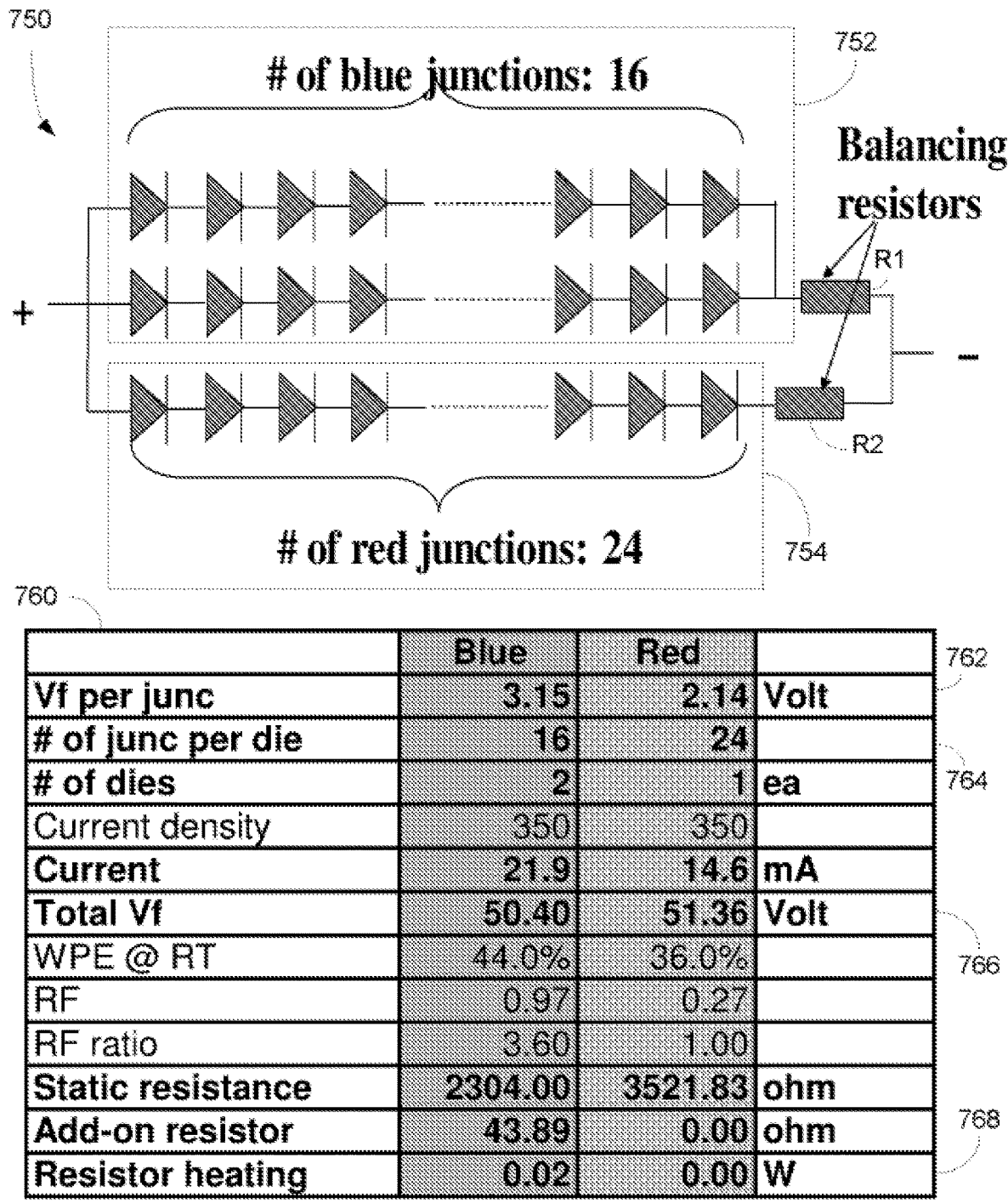
FIG. 7 is a diagram with a chart showing an exemplary layout of SLD capable of adjusting current flow based on operating temperature in accordance with one aspect of the present invention.

FIG. 7 is a diagram with a chart showing an exemplary layout of a SLD 750 capable of adjusting current flow based on operating temperature in accordance with one aspect of the present invention. SLD 750 includes two strings of blue LEDs 752, one string of red LEDs 754, and two balancing resistors RI and R2. RI is coupled to both strings of blue LEDs 752 in series and R2 is coupled to string of red LED 754 in series. Strings of blue and red LEDs are connected in parallel as shown in FIG. 7. SLD 750 is able to maintain an output of warm white light within a predefined range of color temperature using a passive color control scheme. The passive color control scheme, in one aspect, is configured in accordance with electric characteristics between voltage, resistance, and current to passively redistribute current between strings 752-754 based on temperature fluctuation.

Chart 760 illustrates various exemplary calculations associated with SLD 750. For instance, chart 760 shows 2.14 volt ("V") across each red LED junction and 3.15 V across each blue LED junction as indicated by numeral 762. Chart 760 also illustrates that SLD 750 include two blue dies and one red die wherein each blue die includes 16 blue LED junctions while each red die includes 24 LED junctions as indicated by numeral 764. At the room temperature, blue string of LED junctions has total Vf of 50.4 V (16×3.15) while red string of LED junctions has total Vf of 51.36 V (24×2.14) as indicated by numeral 766. As can be seen, the voltages across blue and red string of LED junctions are approximately same or same. Resistor heating 768 of chart 760 shows that change of resistances due to temperature fluctuation is minimal.

SLD 750, in one example, is able to provide a warm white light by mixing red flux, blue flux, and yellow flux wherein the blue and yellow/green flux are supplied by the blue LED junctions while the red flux is supplied by the red LED junctions. With implementation of passive color control scheme, SLD 750 is able to output a range of warm white light by redistributing current passing through strings of red and blue LED junctions 752-754. From the data indicated in chart 760, the implementation of passive color control scheme can be readily achieved.

Figure 8:
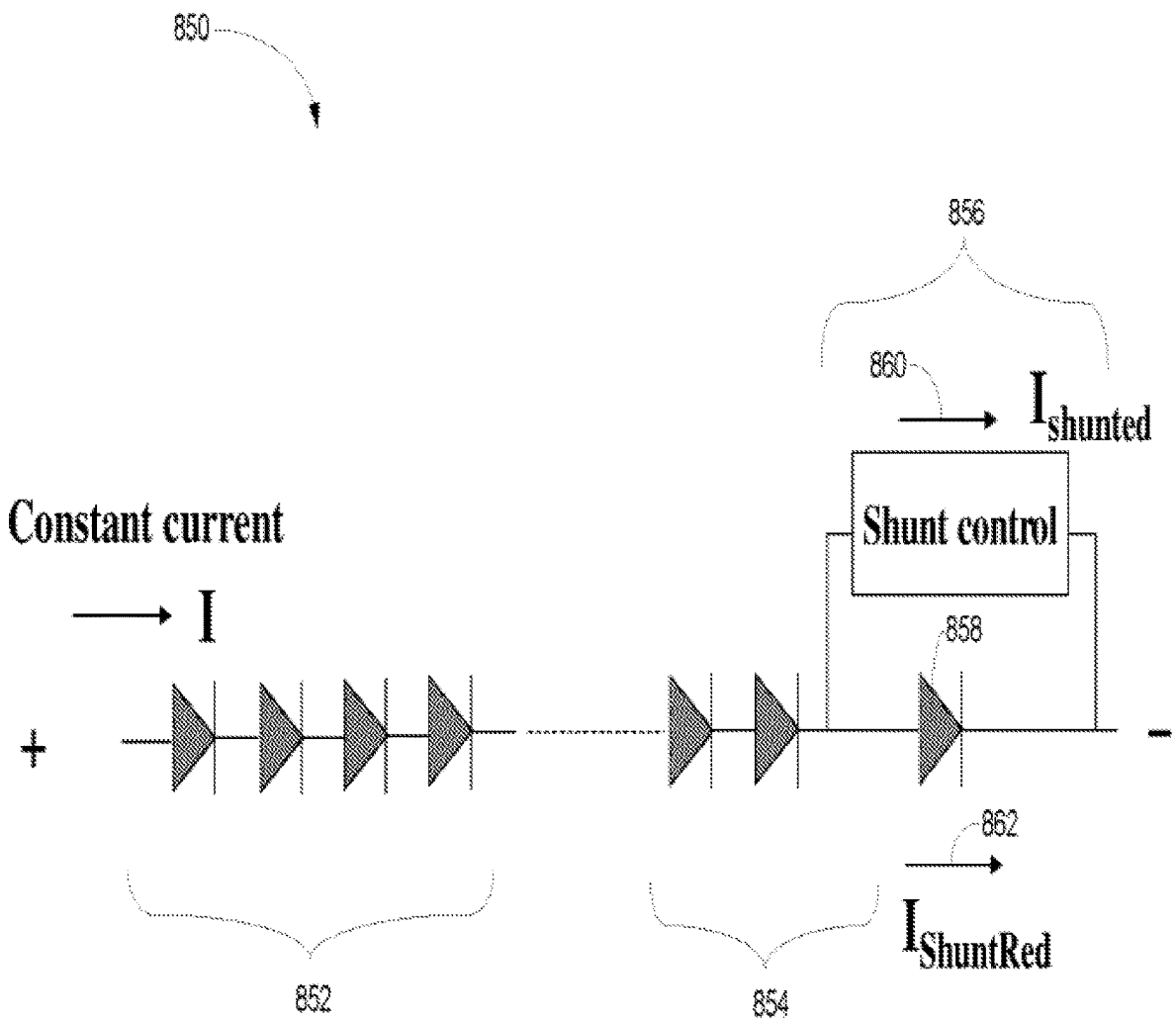
FIG. 8 is a diagram illustrating an alternative configuration of a SLD capable of outputting a warm white light having a color temperature within a predefined range in accordance with one aspect of the present invention.

FIG. 8 is a diagram illustrating an alternative configuration of a SLD 850 capable of outputting a warm white light having a color temperature within a predefined range in accordance with one aspect of the present invention. SLD 850 includes a string of blue LED 852, a string of red LED 854, a shunt controller 856, and a group of shunt red LED 858. Note that the group of shunt red LED 858 contains at least one red LED. It should be noted that the underlying concept of the exemplary aspect(s) of the present invention would not change if one or more elements (or devices) were added to or removed from SLD 850.

During operation, when a current I begins to flow from strings 850-854 to shunt controller 865 bypassing shunt red LED dies 858 via current 860, string 852 emits blue flux by various blue LED and string 854 emits red flux by various red LED. It should be noted that no current flows through shunt red LED 585 when the operating temperature is at room temperature. If no current flows through shunt red LED 585, it does not emit any flux.

As the operating temperature of LEDs gradually rises, the blue flux may drop approximately 10-15% while the red flux may drop around 25-30% since the red LED is more sensitive to temperature fluctuation. When shunt controller 856 detects that the loss of red flux is more than the loss of blue flux, shunt controller 856 begins to redistribute current by redirecting a portion of current 860 to current 862. When current 862 passes through shunt red LED 858, it begins to emit red flux which attempt to compensate the loss of red flux due to temperature fluctuation. When the operating temperature reaches at a steady state such as 80° C., shunt controller 856, in one aspect, redirects all current from current 860 to current 862 whereby shunt red LED 858 is fully activated or illuminated.

Figure 9:
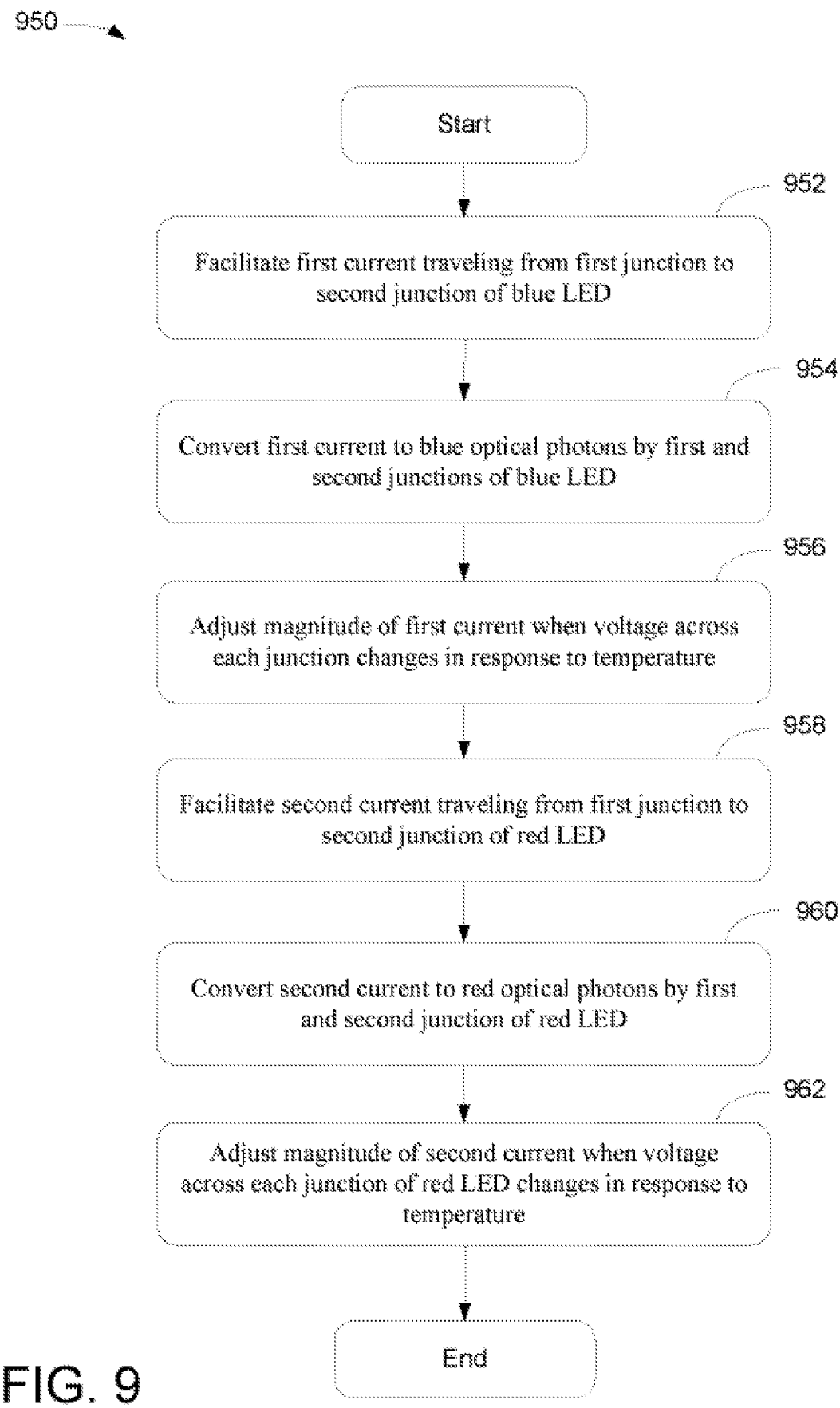
FIG. 9 is a flowchart illustrating a process of generating warm light using blue and red LEDs and redistributing current to compensate flux loss based on temperature variation in accordance with one aspect of the present invention.

FIG. 9 is a flowchart 950 illustrating a process of generating warm white light using a set of blue and red LEDs and is capable of passively compensating the loss of red flux based on temperature variation in accordance with one aspect of the present invention. The process, at block 952, is able to facilitate a first current traveling from a first junction of a blue LED to a second junction of the blue LED. After converting the first current to blue optical photons by the first and second junctions of blue LED at block 954, the process, at block 956, automatically adjusts magnitude of first current when voltage across junction of blue LED changes in response to operating temperature of blue LED.

At block 958, after facilitating a second current traveling from first junction of red LED to second junction of red LED, the second current, at block 960, is converted to red optical photons by the first and second junctions of red LED. The process, at block 962, is able to automatically adjust magnitude of second current when voltage across each junction of red LED changes in response to operating temperature of red LED. The process, in one aspect, is able to redistribute at least a portion of the first current to the second current via a parallel connection in response to voltage drop across the first and second junctions of red LED.

Having briefly described aspects of SLD capable of generating a warm white light using a combination of blue and red LEDs in which the aspect of present invention operates, the following figures illustrate exemplary process and/or method to fabricate and package LED dies, chips, device, and/or fixtures.

Figure 10:
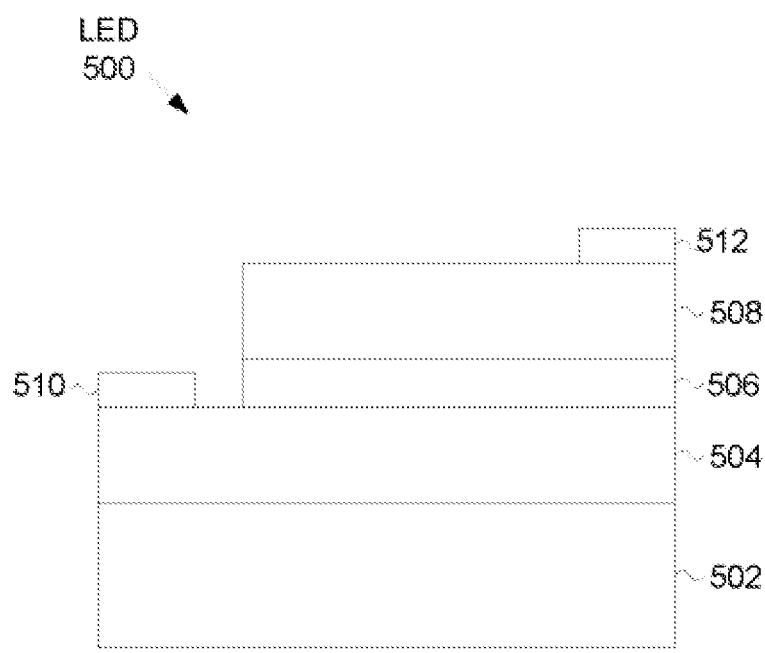
FIG. 10 is a conceptual cross-sectional view illustrating an exemplary fabrication process of an LED or LED devices.

FIG. 10 is a conceptual cross-sectional view illustrating an exemplary fabrication process of an LED, LED die, or LED device. An LED is a semiconductor material impregnated, or doped, with impurities. These impurities add "electrons" or "holes" to the semiconductor, which can move in the material relatively freely. Depending on the kind of impurity, a doped region of the semiconductor can have predominantly electrons or holes, and is referred respectively as n-type or p-type semiconductor regions. Referring to FIG. 10, LED 500 includes an n-type semiconductor region 504 and a p-type semiconductor region 508. A reverse electric field is created at the junction between the two regions, which cause the electrons and holes to move away from the junction to form an active region 506. When a forward voltage sufficient to overcome the reverse electric field is applied across the p-n junction through a pair of electrodes 510, 512, electrons and holes are forced into the active region 506 and recombine. When electrons recombine with holes, they fall to lower energy levels and release energy in the form of light.

In this example, the n-type semiconductor region 504 is formed on a substrate 502 and the p-type semiconductor region 508 is formed on the active layer 506, however, the regions may be reversed. That is, the p-type semiconductor region 508 may be formed on the substrate 502 and the n-type semiconductor region 504 may formed on the active layer 506. As those skilled in the art will readily appreciate, the various concepts described throughout this disclosure may be extended to any suitable layered structure. Additional layers or regions (not shown) may also be included in the LED 500, including but not limited to buffer, nucleation, contact and current spreading layers or regions, as well as light extraction layers.

The p-type semiconductor region 508 is exposed at the top surface, and therefore, the p-type electrode 512 may be readily formed thereon. However, then-type semiconductor region 504 is buried beneath the p-type semiconductor layer 508 and the active layer 506. Accordingly, to form then-type electrode 510 on then-type semiconductor region 504, a cutout area or "mesa" is formed by removing a portion of the active layer 506 and the p-type semiconductor region 508 by means well known in the art to expose the n-type semiconductor layer 504 there beneath. After this portion is removed, the n-type electrode 510 may be formed.

Figure 11:
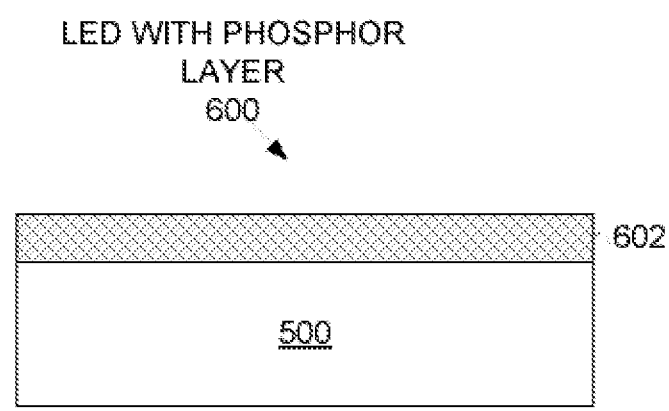
FIG. 11 is a conceptual cross-sectional view illustrating an example of an LED with a phosphor layer.

FIG. 11 is a conceptual cross-sectional view illustrating an example of an LED with a phosphor layer. In this example, a phosphor layer 602 is formed on the top surface of the LED 500 by means well known in the art. The phosphor layer 602 converts a portion of the light emitted by the LED 500 to light having a different spectrum. A white LED light source can be constructed by using an LED that emits light in the blue region of the spectrum and a phosphor that converts blue light to yellow light. A white light source is well suited as a replacement lamp for conventional luminaries; however, the invention may be practiced with other LED and phosphor combinations to produce different color lights. The phosphor layer 602 may include, by way of example, phosphor particles suspended in a carrier or be constructed from a soluble phosphor that is dissolved in the carrier.

Figure 12A:
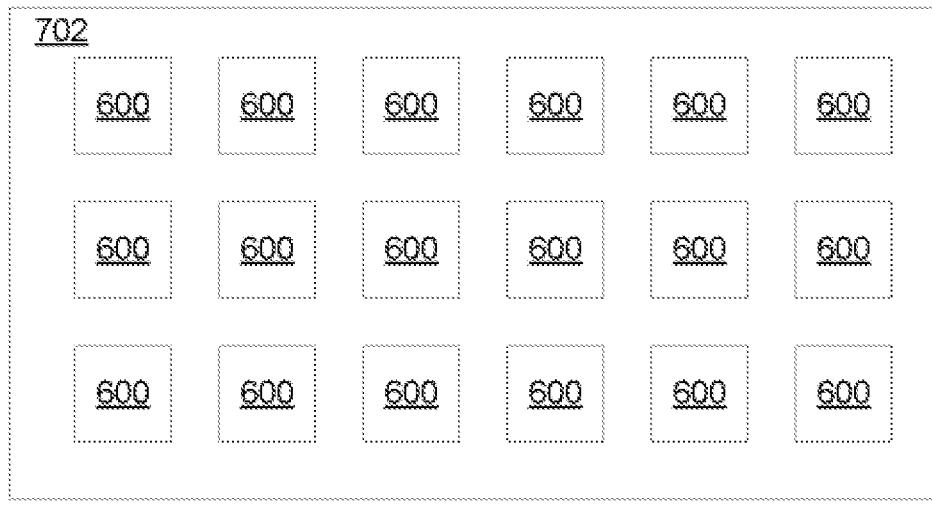
FIG. 12A is a conceptual top view illustrating an example of an LED array using a combination of blue and red LEDs in accordance with one aspect of the present invention.
Figure 12B:
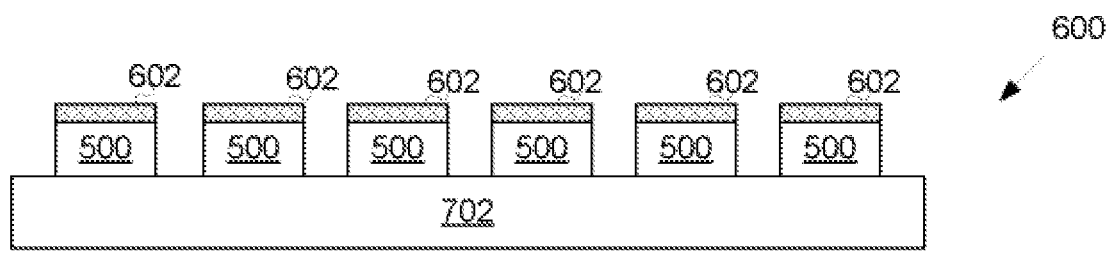
FIG. 12B is a conceptual cross-sectional view of the LED array of FIG. 12A.

In a configuration of LED luminaries, an LED array may be used to provide increased luminance. FIG. 12A is a conceptual top view illustrating an example of an LED array, and FIG. 12B is a conceptual cross-sectional view of the LED array of FIG. 12A. In this example, a number of phosphor-coated LEDs 600 may be formed on a substrate 702. The bond wires (not shown) extending from the LEDs 600 may be connected to traces (not shown) on the surface of the substrate 702, which connect the LEDs 600 in a parallel and/or series fashion. In some aspects, the LEDs 600 may be connected in parallel streams of series LEDs with a current limiting resistor (not shown) in each stream. The substrate 702 may be any suitable material that can provide support to the LEDs 600 and can be mounted within a light fixture (not shown).

Figure 13A:
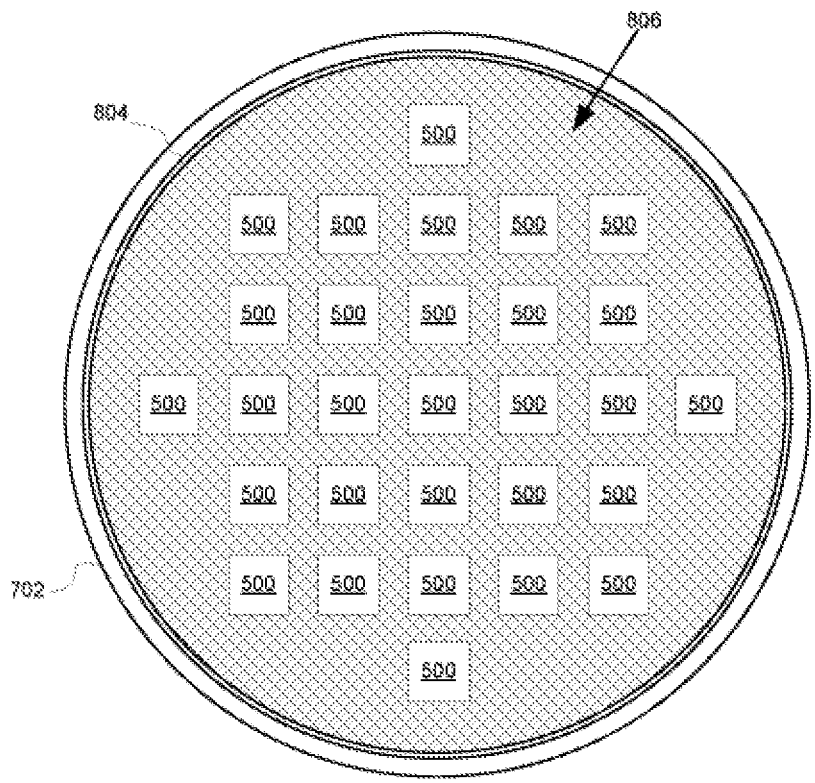
FIG. 13A is a conceptual top view illustrating an example of an alternative configuration of an LED array that can be used with flexible LED connections in accordance with one aspect of the present invention.
Figure 13B:
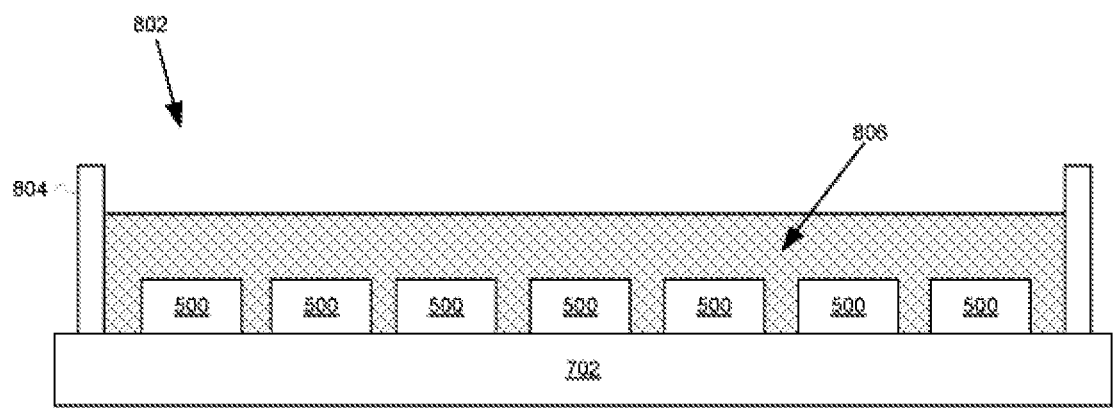
FIG. 13B is a conceptual cross-sectional view of the LED array of FIG. 13A.

FIG. 13A is a conceptual top view illustrating an example of an alternative configuration of an LED array, and FIG. 13B is a conceptual cross-sectional view of the LED array of FIG. 13A. In a manner similar to that described in connection with FIGS. 12A and 12B, a substrate 702 designed for mounting in a light fixture (not shown) may be used to support an array of LEDs 500. However, in this configuration, a phosphor layer is not formed on each individual LED. Instead, phosphor 806 is deposited within a cavity 802 bounded by an annular ring 804 that extends circumferentially around the outer surface of the substrate 702. The annular ring 804 may be formed by boring a cylindrical hole in a material that forms the substrate 702. Alternatively, the substrate 702 and the annular ring 804 may be formed with a suitable mold, or the annular ring 804 may be formed separately from the substrate 702 and attached to the substrate using an adhesive or other suitable means. In the latter configuration, the annular ring 804 is generally attached to the substrate 702 before the LEDs 500, however, in some configurations, the LEDs may be attached first. Once the LEDs 500 and the annular ring 804 are attached to the substrate 702, a suspension of phosphor particles in a carrier may be introduced into the cavity 802. The carrier material may be an epoxy or silicone; however, carriers based on other materials may also be used. The carrier material may be cured to produce a solid material in which the phosphor particles are immobilized.

Figure 14:
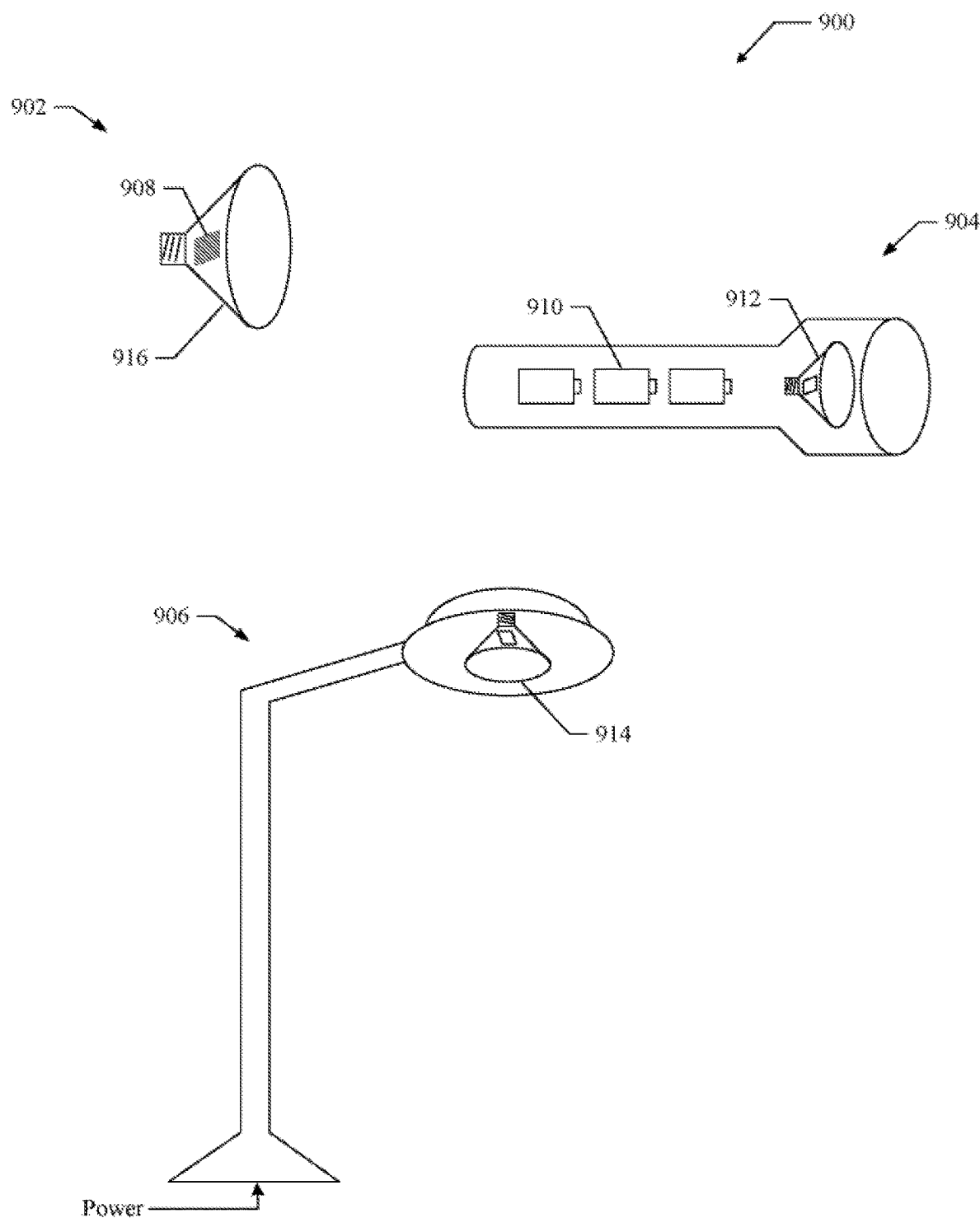
FIG. 14 shows exemplary lighting devices including LED devices using blue and red LEDs in accordance with one aspect of the present invention.

FIG. 14 shows exemplary devices including blue and red LEDs capable of providing a warm white light in accordance with aspects of the present invention. The devices 900 include a lamp 902, an illumination device 904, and a street light 906. Each of the devices shown in FIG. 14 includes LEDs having blue LEDs and red LEDs capable of providing passive color control scheme as described herein. For example, lamp 902 includes a package 916 and an LED 908, in which LED 908 employs one or more metal traces to provide flexible connections. Lamp 902 may be used for any type of general illumination. For example, lamp 902 may be used in an automobile headlamp, street light, overhead light, or in any other general illumination application. Illumination device 904 includes a power source 910 that is electrically coupled to a lamp 912, which may be configured as lamp 902. In one aspect, power source 910 may be batteries or any other suitable type of power source, such as a solar cell. Street light 906 includes a power source connected to a lamp 914, which may be configured as lamp 902. It should be noted that aspects of the LED described herein are suitable for use with virtually any type of LED assembly, which in turn may be used in any type of illumination device and are not limited to the devices shown in FIG. 14.

The various aspects of this disclosure are provided to enable one of ordinary skills in the art to practice the present invention. Various modifications to aspects presented throughout this disclosure will be readily apparent to those skilled in the art, and the concepts disclosed herein may be extended to other LED lamp configurations regardless of the shape or diameter of the glass enclosure and the base and the arrangement of electrical contacts on the lamp. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skills in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A solid-state lighting device comprising:
   a string of first light-emitting diodes ("LEDs") having multiple junctions configured to convert electrical energy to bluish optical light;
   a string of second LEDs having multiple junctions configured to convert electrical energy to reddish light, wherein a first end of the string of second LEDs is coupled to the string of first LED in series; and
   a red light flux balancing element coupled in series to the string of second LEDs, the red light flux balancing element comprising a shunt controller in parallel with at least one shunt red LED, the shunt controller configured to redistribute current passing through the at least one shunt red LED in response to fluctuation of junction temperature of the string of second LEDs and to detect loss of red flux in response to temperature fluctuation.

2. The device of claim 1, wherein the shunt controller is a passive resistor having a predefined value based on physical properties of second LEDs.

3. The device of claim 1, wherein the string of first LEDs is able to convert electrical energy to blue light having a range of wavelengths from 400 nm to 500 nm.

4. The device of claim 1, wherein the string of second LEDs is able to convert electrical energy to red light having a range of wavelengths between 580 nm and 700 nm.

5. The device of claim 1, wherein the red light flux balancing element is coupled to a second end of the string of second LEDs, the second end being different from the first end of the string of second LEDs.

* * * * *